US012771318B2

(12) United States Patent
Pao et al.

(10) Patent No.: US 12,771,318 B2
(45) Date of Patent: Oct. 20, 2026

(54) SUSPENDED RESONATOR

(71) Applicant: TXC Corporation, Taipei City (TW)

(72) Inventors: Shih-Yung Pao, Taoyuan City (TW); Tzu-Hsiu Peng, Taipei City (TW); Zong-De Lin, Taipei City (TW)

(73) Assignee: TXC Corporation, Taipei City (TW)

( * ) Notice: Subject to any disclaimer, the term of this patent is extended or adjusted under 35 U.S.C. 154(b) by 932 days.

(21) Appl. No.: 18/163,797

(22) Filed: Feb. 2, 2023

(65) Prior Publication Data

US 2024/0120900 A1 Apr. 11, 2024

(30) Foreign Application Priority Data

Oct. 6, 2022 (TW) ................................. 111137991

(51) Int. Cl.
*H03H 9/00* (2006.01)
*H03H 9/02* (2006.01)
*H03H 9/10* (2006.01)
*H03H 9/13* (2006.01)
*H03H 9/17* (2006.01)

(52) U.S. Cl.
CPC ........ *H03H 9/173* (2013.01); *H03H 9/02133* (2013.01); *H03H 9/10* (2013.01); *H03H 9/13* (2013.01)

(58) Field of Classification Search
CPC ...... H03H 9/173; H03H 9/02133; H03H 9/10; H03H 9/13; H03H 9/02086; H03H 9/1021; H03H 9/17; H03H 9/02157; H03H 9/132
See application file for complete search history.

(56) References Cited

U.S. PATENT DOCUMENTS

2012/0062340 A1 3/2012 Huang et al.
2018/0048284 A1* 2/2018 Nakamura ........... H03H 9/2452
2019/0245515 A1 8/2019 Hurwitz

FOREIGN PATENT DOCUMENTS

CN 110289823 9/2019
JP 2003101377 4/2003
(Continued)

OTHER PUBLICATIONS

"Office Action of Japan Counterpart Application", issued on Jun. 28, 2024, p. 1-p. 6.
(Continued)

*Primary Examiner* — Julio C. Gonzalez
(74) *Attorney, Agent, or Firm* — JCIPRNET

(57) ABSTRACT

A suspended resonator including a vibration structure, a first electrode, and a second electrode is provided. The vibration structure includes a vibration region, a frame portion, and a connecting portion. The vibration region includes a plate portion and a thickening portion. The plate portion has a first surface and a second surface opposite to each other. The thickening portion surrounds a central part of the plate portion, and an edge part of the plate portion is sandwiched in the thickening portion. A thickness of the thickening portion is greater than a thickness of the plate portion. The frame portion surrounds the vibration region and maintains a gap with the vibration region. The connecting portion connects the thickening portion with the frame portion. The first electrode is disposed on the first surface. The second electrode is disposed on the second surface.

7 Claims, 4 Drawing Sheets

(56) References Cited

FOREIGN PATENT DOCUMENTS

| | | | | |
|---|---|---|---|---|
| JP | 2006254210 | | | 9/2006 |
| JP | 2006254210 | A | * | 9/2006 |
| JP | 2010130400 | | | 6/2010 |
| JP | 2015019240 | | | 1/2015 |
| JP | 2017085327 | | | 5/2017 |
| JP | 2020141358 | | | 9/2020 |
| JP | 2020141358 | A | * | 9/2020 |
| TW | M479521 | | | 6/2014 |

OTHER PUBLICATIONS

"Office Action of Taiwan Counterpart Application", issued on Sep. 1, 2023, p. 1-p. 8.

* cited by examiner

SUSPENDED RESONATOR

CROSS-REFERENCE TO RELATED APPLICATION

This application claims the priority benefit of Taiwan application serial no. 111137991, filed on Oct. 6, 2022. The entirety of the above-mentioned patent application is hereby incorporated by reference herein and made a part of this specification.

BACKGROUND

Technical Field

The disclosure is relative to a resonator, and more particularly to a suspended resonator.

Description of Related Art

A resonator is an electronic component that utilizes the piezoelectric properties of the material and the natural resonance frequency of the material. The resonance frequency is related to the thickness of the resonator chip. Thus, in the application of ultra-high frequency, general flat resonator chips are too thin. For example, the thickness of the flat resonator chip with a resonance frequency of 300 MHz or more is less than 5 microns. Thin plate resonator chips have low structural rigidity and weak strength. Due to the external force of mechanical vibration or inertia force, the chip will be excessively deformed and there is a high risk of hitting the upper and lower adjacent components.

Thus, as the resonant frequency increases, it is important for researchers in this field to actively study how to tackle the problem of the resonator chip being too thin and easily hitting the upper and lower adjacent components.

SUMMARY

The disclosure provides a suspended resonator, which effectively avoids the problem of excessive deformation amount of the vibration structure resulting in hitting adjacent components.

An embodiment of the disclosure proposes a suspended resonator including a vibration structure, a first electrode, and a second electrode. The vibration structure includes a vibration region, a frame portion, and a connecting portion. The vibration region includes a plate portion and a thickening portion. The plate portion includes a first surface and a second surface opposite to each other, a central part, and an edge part. The thickening portion surrounds the central part of the plate portion. The edge part of the plate portion is sandwiched in the thickening portion and a thickness of the thickening portion is greater than a thickness of the plate portion. The frame portion surrounds the vibration region and maintains a gap with the vibration region. The connecting portion connects the thickening portion with the frame portion. The first electrode is disposed on the first surface, and the second electrode is disposed on the second surface.

In the suspended resonator of the embodiment of the disclosure, the thickness of the thickening portion of the vibration region is greater than the thickness of the plate portion. Thus, the deformation amount of the vibration region during vibration is reduced, thereby effectively avoiding the problem of excessive deformation amount of the vibration structure due to the external force of mechanical vibration or inertia force resulting in hitting adjacent components.

DESCRIPTION OF THE EMBODIMENTS

Figure 1:
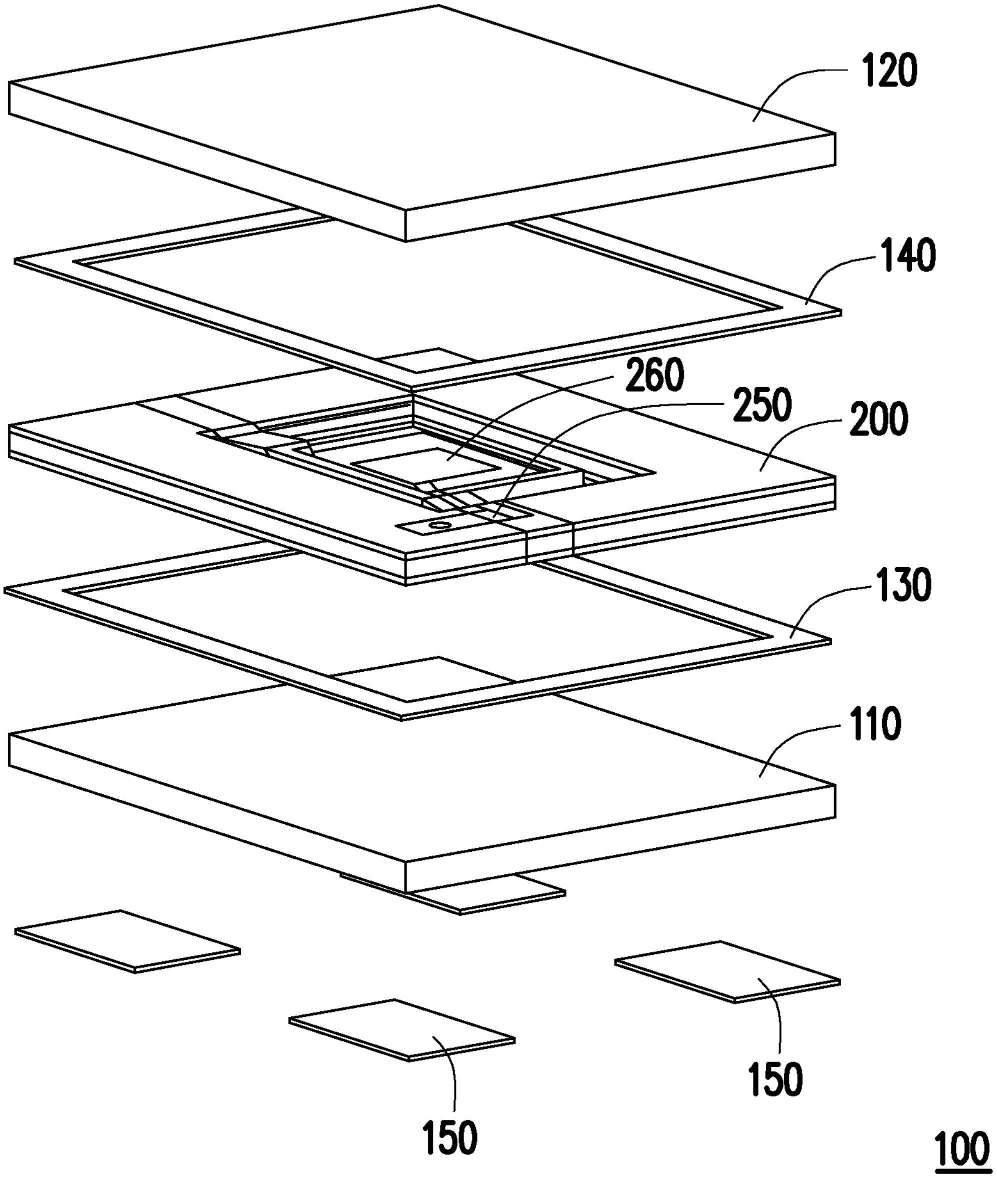
FIG. 1 is an exploded view of a suspended resonator of an embodiment of the disclosure.
Figure 2A:
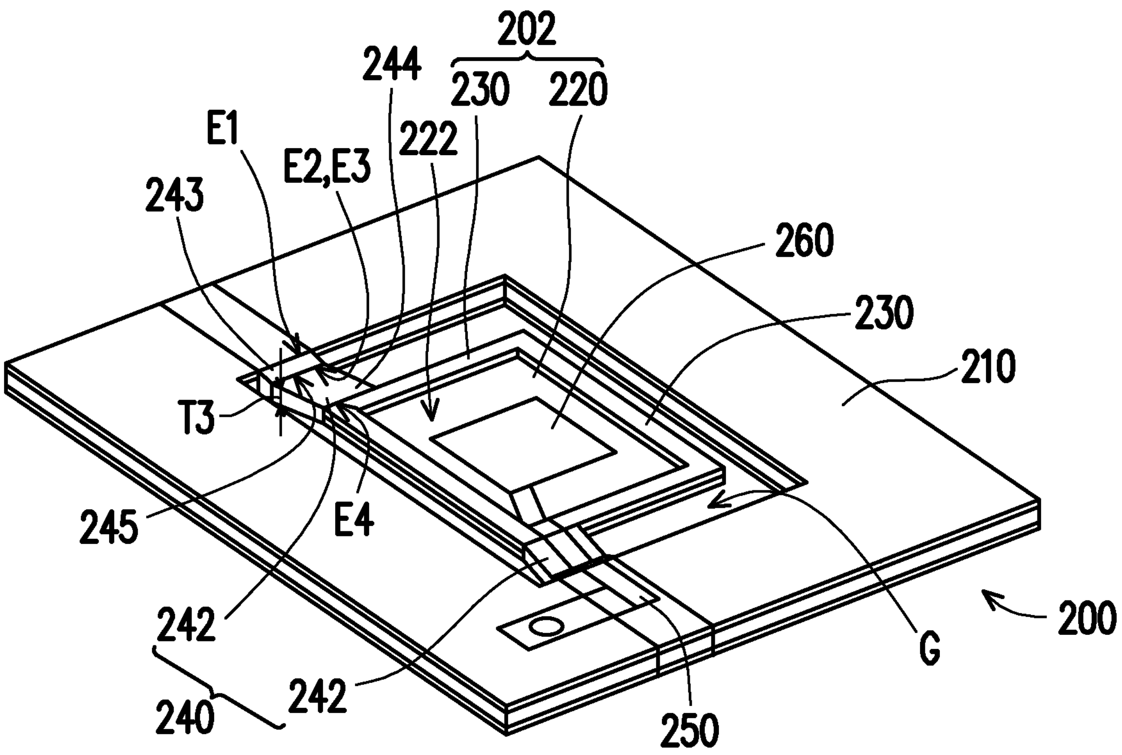
FIG. 2A is a perspective schematic view of the vibration structure and the first electrode in FIG. 1.
Figure 2B:
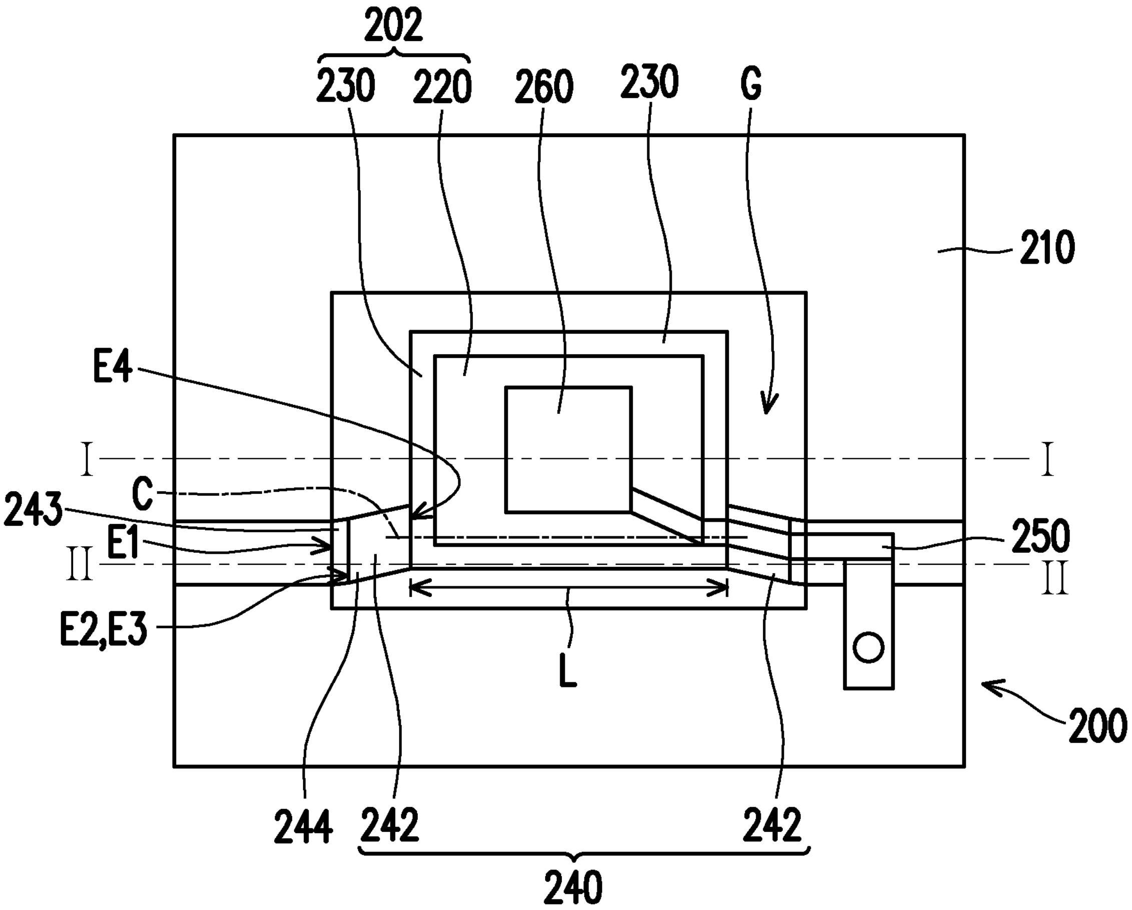
FIG. 2B is a schematic top view of the vibration structure and the first electrode of FIG. 2A.
Figure 2C:
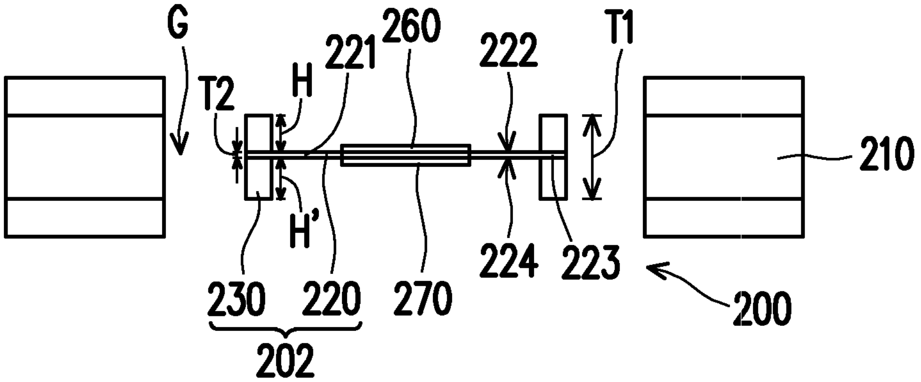
FIG. 2C is a cross-sectional schematic view of the vibration structure and the first electrode, and a second electrode below the vibration structure taken along the line I-I of FIG. 2B.
Figure 2D:
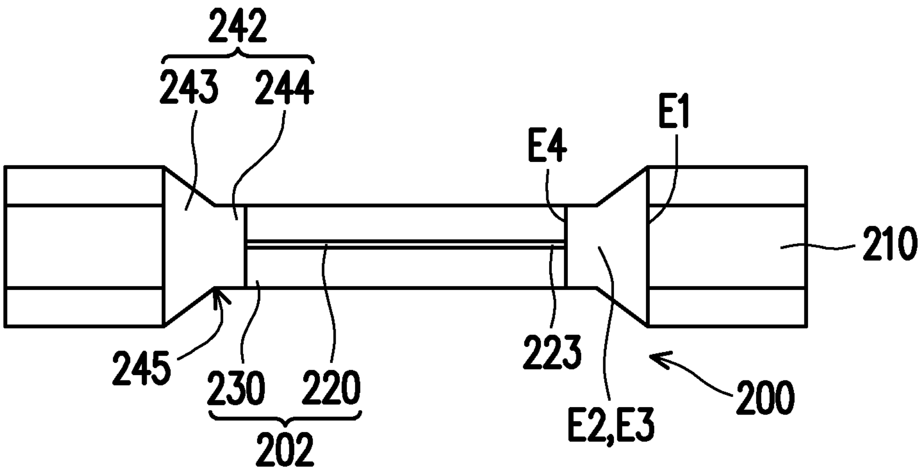
FIG. 2D is a cross-sectional schematic view of the vibration structure taken along the line II-II of FIG. 2B.

FIG. 1 is an exploded view of a suspended resonator of an embodiment of the disclosure. FIG. 2A is a three-dimensional schematic view of the vibration structure and the first electrode in FIG. 1. FIG. 2B is a schematic top view of the vibration structure and the first electrode of FIG. 2A. FIG. 2C is a cross-sectional schematic view of the vibration structure and the first electrode, and a second electrode below the vibration structure taken along a line I-I of FIG. 2B. FIG. 2D is a cross-sectional schematic view of the vibration structure taken along the line II-II of FIG. 2B. Referring to FIG. 1 and FIGS. 2A to 2D, the suspended resonator 100 of this embodiment includes a vibration structure 200, a first electrode 260, and a second electrode 270 (as shown in FIG. 2C). The vibration structure 200 includes a vibration region 202, a frame portion 210, and a connecting portion 240. The vibration region 202 includes a plate portion 220 and a thickening portion 230. The plate portion 220 includes a first surface 222 and a second surface 224 opposite to each other, a central part 221, and an edge part 223. The thickening portion 230 surrounds the central part 221 of the plate portion 220. The edge part 223 of the plate portion 220 is sandwiched in the thickening portion 230 and a thickness T1 of the thickening portion 230 is greater than a thickness T2 of the plate portion 220. The frame portion 210 surrounds the vibration region 202 and maintains a gap G with the vibration region 202. The connecting portion 240 connects the thickening portion 230 with the frame portion 210. The first electrode 260 is disposed on the first surface 222, and the second electrode 270 is disposed on the second surface 224.

In this embodiment, the material of the vibration structure 200 is a piezoelectric material, such as quartz or other piezoelectric materials. In response to a voltage difference being applied between the first electrode 260 and the second electrode 270, the plate portion 220 is deformed due to a reverse piezoelectric effect. Then, in response to the voltage difference being removed, the plate portion 220 vibrates. Furthermore, a voltage change is generated between the first electrode 260 and the second electrode 270 along with the vibration due to a piezoelectric effect, so that the first electrode 260 and the second electrode 270 output a voltage signal.

In this embodiment, the connecting portion 240 includes two connecting sections 242 respectively connected to two opposite sides of the vibration region 202, so that the vibration region 202 forms a suspended structure. In an embodiment, a connecting line C of the two connecting sections 242 deviates from a center of the vibration region 202. Furthermore, in this embodiment, a thickness T3 of the connecting portion 240 is greater than the thickness T2 of the plate portion 220. In an embodiment, the thickness T3 of the connecting portion 240 may be approximately the same as the thickness T1 of the thickening portion 230.

In this embodiment, the suspended resonator 100 further includes a base 110, a first sealing ring 130, a second sealing ring 140, and an upper cover 120. The first sealing ring 130 is disposed on the base 110, and the vibration structure 200 is disposed on the first sealing ring 130. An upper side and a lower side of the first sealing ring 130 lean on an edge of the vibration structure 200 and an edge of the base 110, respectively. The second sealing ring 140 is disposed on the vibration structure 200 and the upper cover 120 is disposed on the second sealing ring 140. An upper side and a lower side of the second sealing ring 140 lean on an edge of the upper cover 120 and an edge of the vibration structure 200, respectively. In this embodiment, the first sealing ring 130 and the second sealing ring 140 are rectangular rings. In addition, in this embodiment, the suspended resonator 100 further includes a plurality of pads 150 disposed under the base 110 and electrically connected to the first electrode 260 and the second electrode 270, respectively. For example, the pads 150 is electrically connected to the first electrode 260 and the second electrode 270 respectively through a conductive trace 250 and another conductive trace located on the back side of the connecting section 242 of FIG. 2A. The conductive trace 250 may extend from the first electrode 260 to a surface of the frame portion 210 via a surface of one of the connecting sections 242 (the connecting section 242 on the right side of FIG. 2A). The above-mentioned another conductive trace may extend from the second electrode 270 to the surface of the frame portion 210 via a surface of another connecting section 242 (the connecting section 242 on the left side of FIG. 2A) on the backside of FIG. 2A.

In the suspended resonator 100 of this embodiment, the thickness T1 of the thickening portion 230 of the vibration region 202 is greater than the thickness T2 of the plate portion 220 of the vibration region 202, and the thickness T3 of the connecting portion 240 may also be greater than the thickness T2 of the plate portion 220. Thus, the structural rigidity and strength are enhanced, and the deformation amount of the vibration region 202 during vibration is reduced, thereby effectively avoiding the problem of excessive deformation amount of the vibration structure 200 due to the external force of mechanical vibration or inertia force resulting in hitting adjacent components (e.g., upper cover 120 and base 110). In addition, since the vibration region 202 and the frame portion 210 are connected through the connecting portion 240, the effect of isolating the thermal stress generated by the process from being transferred to the vibration region 202 is maintained.

Figure 3:
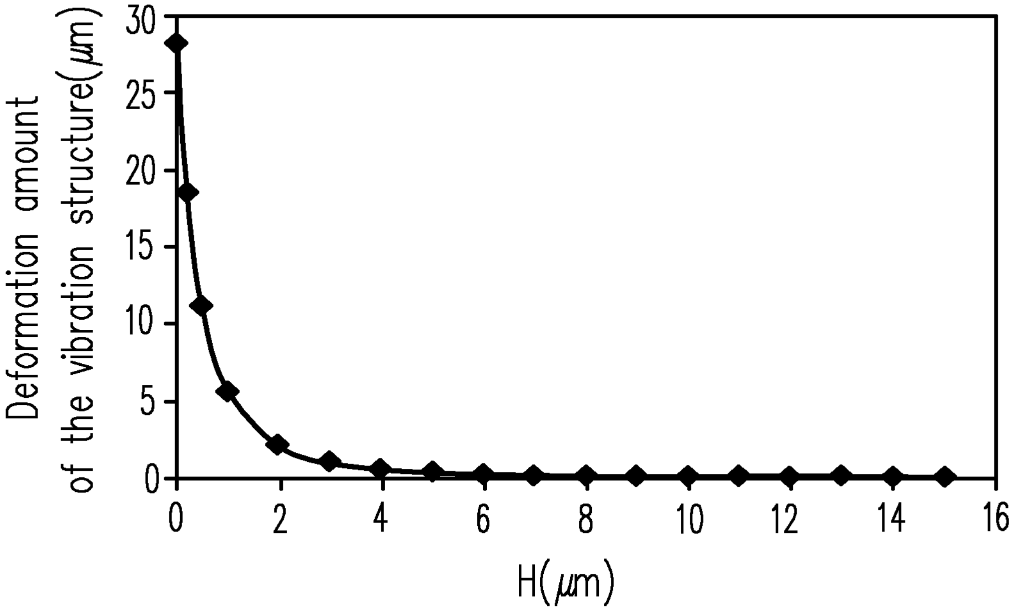
FIG. 3 is a curve showing the change in the deformation amount of the vibration structure of the suspended resonator of FIG. 1 during vibration relative to the protrusion height of the thickening portion relative to the first surface.

In this embodiment, a protrusion height of the thickening portion 230 relative to the first surface 222 is H, a length of the vibration region 202 in an arrangement direction (i.e., an extending direction of the connecting line C) of the two connecting sections 242 is L, and the suspended resonator 100 meets $0.01<H/L<0.8$. In addition, a height of the thickening portion 230 protruding relative to the second surface 224 is H'. In this embodiment, H=H'. FIG. 3 is a curve showing the change in the deformation amount of the vibration structure of the suspended resonator of FIG. 1 during vibration relative to the protrusion height H of the thickening portion relative to the first surface. It can be seen from FIG. 3 that, in a comparative example, when the protrusion height H of the thickening portion 230 relative to the first surface 222 is 0, the deformation amount of the vibration structure 200 during vibration is as high as 28 microns (μm). At this time, the excessive deformation amount of the vibration structure 200 due to the external force of mechanical vibration or inertia force results in hitting adjacent components (e.g., upper cover 120 and base 110). However, when the protrusion height H of the thickening portion 230 relative to the first surface 222 is greater than 4 microns, the deformation amount of the vibration structure 200 during vibration is reduced to 1 micron or less. Thus, the problem of excessive deformation amount of the vibration structure 200 due to the external force of mechanical vibration or inertia force resulting in hitting adjacent components (e.g., upper cover 120 and base 110) is effectively avoided. In this embodiment, L is, for example, 400 microns. Therefore, when $H>4$ microns, $H/L>0.01$. At this time, the deformation amount of the vibration structure 200 during vibration is reduced to 1 micron or less.

In this embodiment, each of the two connecting sections 242 includes a gentle slope sub-section 243 and an extending sub-section 244. A first end E1 of the gentle slope sub-section 243 is connected to the frame portion 210, a second end E2 of the gentle slope sub-section 243 is connected to a third end E3 of the extending sub-section 244, and a fourth end E4 of the extending sub-section 244 is connected to the thickening portion 230. The first end E1 is opposite to the second end E2, the third end E3 is opposite to the fourth end E4, and a thickness of the gentle slope sub-section 243 decreases from the first end E1 to the second end E2. A V-shaped recessed surface 245 is provided at the junction of the second end E2 and the third end E3, as shown in FIG. 2A and FIG. 2D. The gentle slope sub-section 243 is configured to reduce stress concentrations.

To sum up, in the suspended resonator of the embodiment of the disclosure, the thickness of the thickening portion of the vibration region is greater than the thickness of the plate portion. Thus, the deformation amount of the vibration region during vibration is reduced, thereby effectively avoiding the problem of excessive deformation amount of the vibration structure due to the external force of mechanical vibration or inertia force resulting in hitting adjacent components.

What is claimed is:

1. A suspended resonator, comprising:

a vibration structure, comprising:

a vibration region, comprising:

a plate portion, comprising a first surface and a second surface opposite to each other, a central part, and an edge part; and a thickening portion, surrounding the central part of the plate portion, wherein the edge part of the plate portion is sandwiched in the thickening portion and a thickness of the thickening portion is greater than a thickness of the plate portion;

a frame portion, surrounding the vibration region and maintaining a gap with the vibration region; and a connecting portion, connecting the thickening portion with the frame portion;

a first electrode, disposed on the first surface; and a second electrode, disposed on the second surface, wherein the connecting portion comprises two connecting sections respectively connected to two opposite sides of the vibration region, and each of the two connecting sections comprises:

a gentle slope sub-section with a first end connected to the frame portion; and an extending sub-section, wherein a second end of the gentle slope sub-section is connected to a third end of the extending sub-section, a fourth end of the extending sub-section is connected to the thickening portion, the first end is opposite to the second end, the third end is opposite to the fourth end, and a thickness of the gentle slope sub-section decreases from the first end to the second end.

2. The suspended resonator according to claim 1, wherein a connecting line of the two connecting sections deviates from a center of the vibration region.

3. The suspended resonator according to claim 1, wherein a protrusion height of the thickening portion relative to the first surface is H, a length of the vibration region in an arrangement direction of the two connecting sections is L, and the suspended resonator meets $0.01<H/L<0.8$.

4. The suspended resonator according to claim 1, wherein a material of the vibration structure is a piezoelectric material.

5. The suspended resonator according to claim 1, further comprising:

a base;

a first sealing ring, disposed on the base, wherein the vibration structure is disposed on the first sealing ring;

a second sealing ring, disposed on the vibration structure; and an upper cover, disposed on the second sealing ring.

6. The suspended resonator according to claim 5, further comprising: a plurality of pads, disposed under the base and electrically connected to the first electrode and the second electrode respectively.

7. The suspended resonator according to claim 5, wherein a thickness of the connecting portion is greater than a thickness of the plate portion.

* * * * *